United States Patent [19]
Jeng et al.

[11] Patent Number: 5,994,228
[45] Date of Patent: Nov. 30, 1999

[54] METHOD OF FABRICATING CONTACT HOLES IN HIGH DENSITY INTEGRATED CIRCUITS USING TAPER CONTACT AND SELF-ALIGNED ETCHING PROCESSES

[75] Inventors: Erik S. Jeng, Taipei; Fu-Liang Yang, Tainan; Tzu-Shih Yen, Taipei, all of Taiwan

[73] Assignee: Vanguard International Semiconductor Corporation, Hsin-Chu, Taiwan

[21] Appl. No.: 08/827,818

[22] Filed: Apr. 11, 1997

[51] Int. Cl.⁶ .............................. H01L 21/00; H01L 21/70
[52] U.S. Cl. ..................... 438/698; 438/701; 438/706; 438/713; 438/721
[58] Field of Search .................................. 438/701, 698, 438/706, 713, 721

[56] References Cited

U.S. PATENT DOCUMENTS

| | | | |
|---|---|---|---|
| 4,966,867 | 10/1990 | Crotti et al. | 438/701 |
| 5,219,793 | 6/1993 | Cooper et al. | 438/624 |
| 5,340,774 | 8/1994 | Yen | 438/301 |
| 5,444,020 | 8/1995 | Lee et al. | 437/195 |
| 5,476,807 | 12/1995 | Lee et al. | 438/396 |

OTHER PUBLICATIONS

Wolf, "Silicon Processing for the VLSI Era–vol. 2" Lattice Press Sunset Beach, CA, 1990, p. 539.
Wolf, "Silicon Processing for the VLSI Era–vol. 3" Lattice Press, Sunset Beach, CA, 1995, p. 398.

*Primary Examiner*—Robert Kunemund
*Assistant Examiner*—Lynette T. Umez-Eronini
*Attorney, Agent, or Firm*—George O. Saile; Stephen B. Ackerman

[57] ABSTRACT

A method for fabricating contact holes in high density integrated circuits and the resulting structure are disclosed. It is shown that by judiciously integrating the process of forming shallow tapered holes with self-alignment techniques, self-aligned holes can be fabricated with reduced number of masking process steps. This is accomplished by first forming shallow tapered holes to a certain depth over certain regions in a substrate by means of isotropic etching and then extending them by anisotropic etching to full depth corresponding to the regions they are allowed to contact. The net result is a whole set of holes which are self-aligned and which are formed by means of a single photoresist mask.

20 Claims, 6 Drawing Sheets

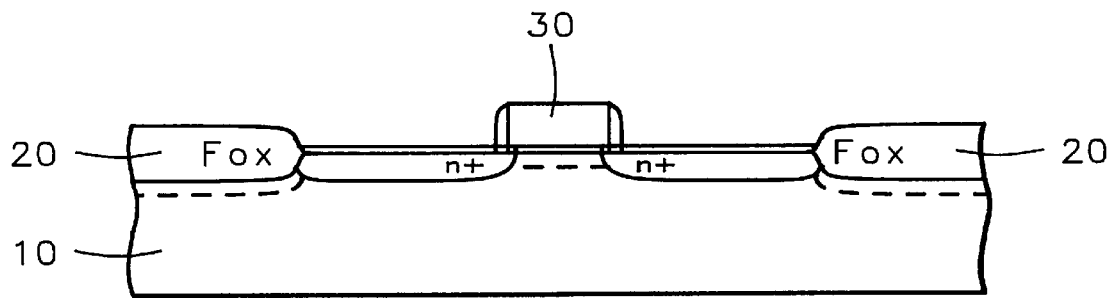
FIG. 1a – Prior Art
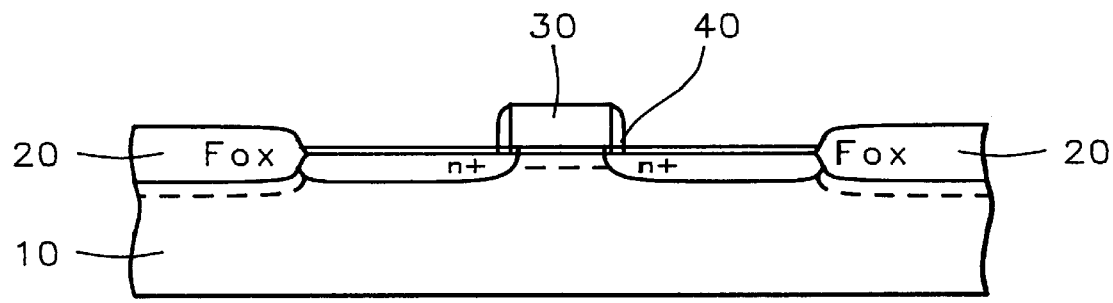
FIG. 1b – Prior Art
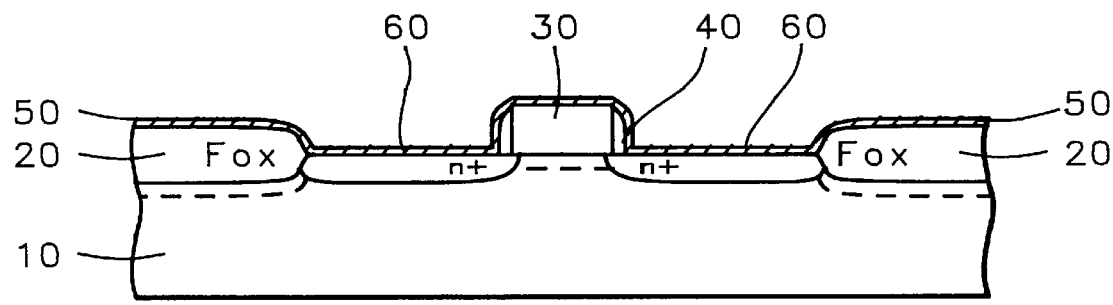
FIG. 1c – Prior Art

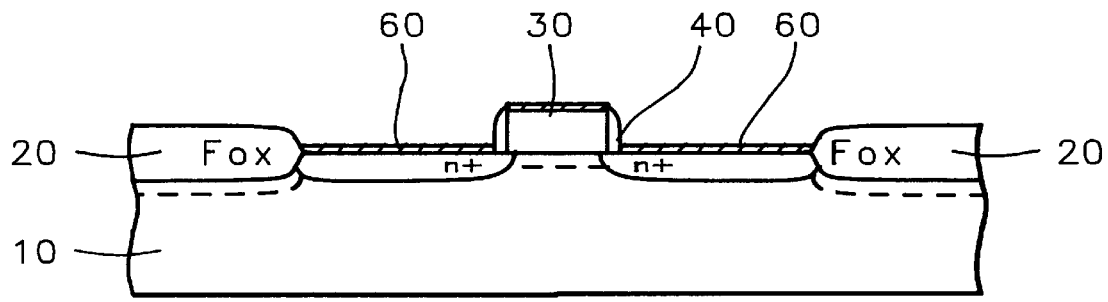
*FIG. 1d – Prior Art*
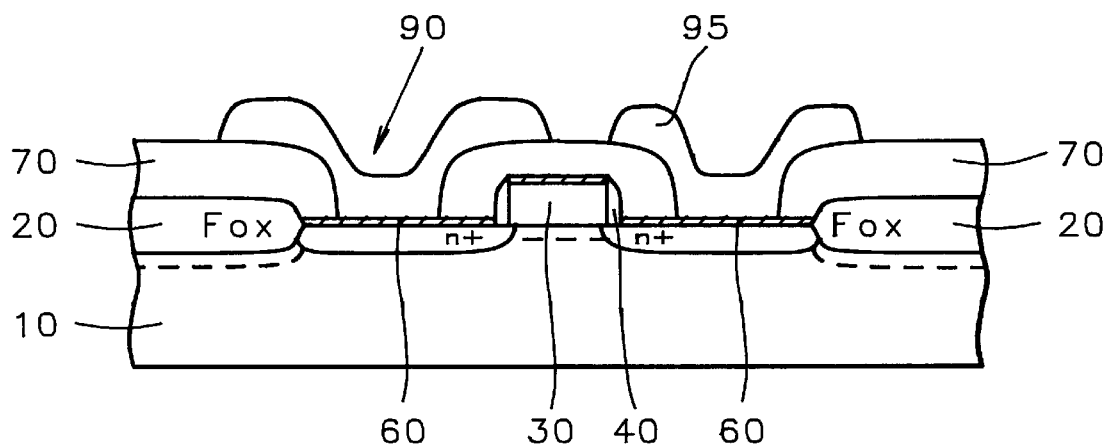
*FIG. 1e – Prior Art*
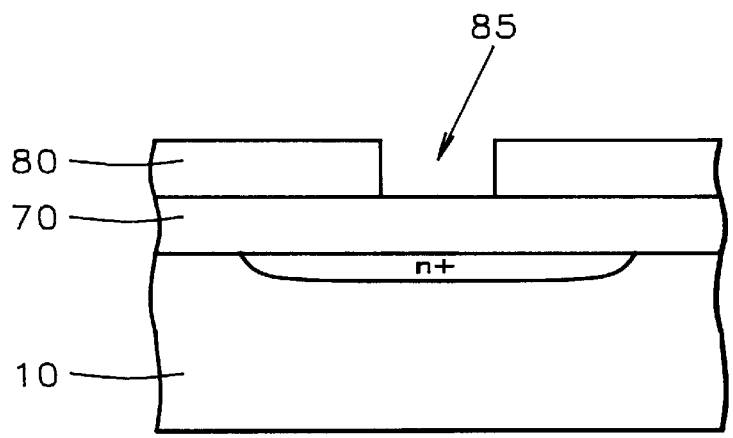
*FIG. 2a – Prior Art*

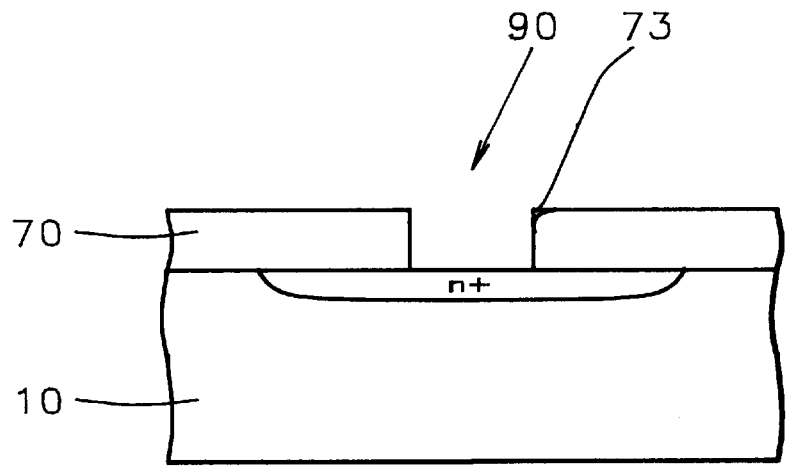
*FIG. 2b - Prior Art*
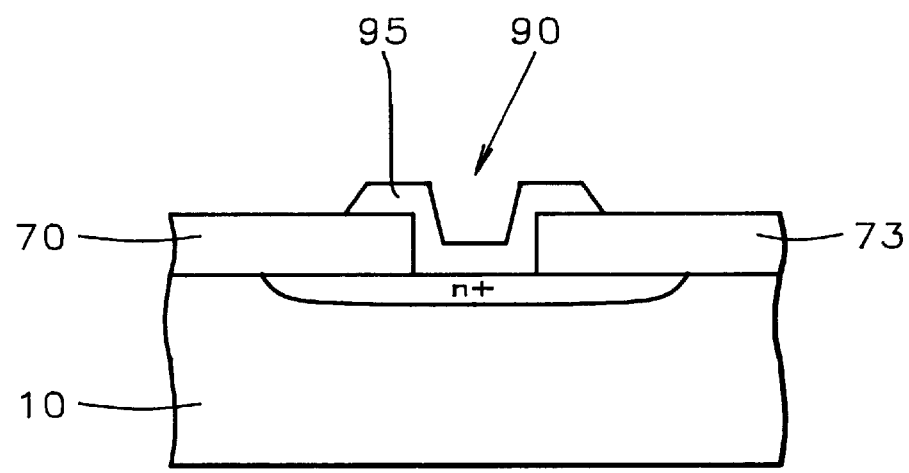
*FIG. 2c - Prior Art* ns together.

METHOD OF FABRICATING CONTACT HOLES IN HIGH DENSITY INTEGRATED CIRCUITS USING TAPER CONTACT AND SELF-ALIGNED ETCHING PROCESSES

BACKGROUND OF THE INVENTION (1) Field of the Invention

The present invention relates to manufacturing of semiconductor devices in general, and in particular, to manufacturing of contact holes using self-aligned etching and tapering processes together.

(2) Description of the Related Art

Conventional fabrication of contact holes in semiconductor devices normally requires several masking and etching process steps. Holes, or windows, that are made to open up on to areas where there are semiconductor devices that are formed in a substrate, such as silicon or gallium-arsenide, are called contact holes. On the other hand, holes that are made to form a connection between conductive layers in a semiconductor wafer are known as via holes. Whether contact or via holes, they are later filled with conductive material to establish contact between the various components of an integrated circuit.

Holes are made by etching through the insulation layers that separate the conductive layers. Specifically, a photoresist is first applied as a thin film to the insulating layer and subsequently exposed through a mask. The mask contains clear and an opaque features that define the pattern of a hole. The area of the photoresist film which is exposed to light is soluble (in the case of a positive photoresist) and the exposed portion is removed in a subsequent development process. The remainder of the photoresist film acts as an etch-mask. A succeeding etching step removes the exposed part of the insulating layer but does not remove the insulating layer located under the photoresist mask. This results in the formation of a hole.

In fabricating holes in the sub-micron range, aligning hole patterns on a mask over the area where the hole is to be formed can be critical. As is well known, in a MOS structure for example, the area of the source/drain regions cannot easily be minimized commensurate with the sub-micron technologies because the contact hole has to be aligned to these regions with a separate masking step, and extra area has to be allocated for misalignment. However, the larger area results in increased source/drain-to-substrate junction capacitance, which slows down the device speed. Also, if the contact resistance is to be minimized for smaller contact holes contacting sub-micron size devices, all of the area that is available must be used without sacrificing any areas for want of proper alignment. Therefore, alternative contact structures must be devised. One such structure is that which is formed by means of what is called self-alignment. In a self-aligned contact (SAC) structure, the contact on the source/drain regions is formed at the same time that another contact is formed on the gate of a MOS structure, hence eliminating the need for separate masking steps for forming contact with the gate and then the source/drain. After the formation of contacts, additional steps are needed to form the contact holes to make the necessary connections between the devices of the integrated circuit, as is well known in the art. Furthermore, depending upon whether they are peripheral circuits or cells in the integrated circuit chip, different steps may be required in making the holes because of different etch requirements for different underlying materials in the holes, as will be described later along with a hole contouring method for tapering.

A SAC process for forming contact with silicon is the well-known self-aligned silicide (salicide) process which reduces the number of masking steps. Silicides are binary metal compounds of silicon which are formed by well known methods such as co-evaporation or co-sputtering of a refractory metal and silicon. It is the reaction of suicides with silicon that enables the SAC process. Namely, after the source and drain regions ($n^+$) of the well-known MOS structure (see, for example, S. Wolf and R. N. Tauber, "Silicon Processing for the VLSI Era," vol. 3, Lattice Press, Sunset Beach, Calif., 1990, p 398) on a substrate (10) shown in FIG. 1a have been implanted to form the source/drain junctions, the polysilicon (poly-Si) gate (30) sidewall spacers (40) are formed. As is commonly practiced in the art, sidewall spacers are formed by first depositing oxide on the MOS structure and etching anisotropically to leave the corners of the gate filled with residual oxide to form the spacers (40) shown in FIG. 1b. Oxide spacers prevent the gate and source/drain areas from being electrically connected when a metal (50) used to form silicide is deposited. As the whole structure is then heated, the deposited metal reacts with silicon wherever it contacts with silicon including polysilicon. Everywhere else, the metal remains unreacted. The unreacted metal is selectively removed through the use of an etchant that does not attack the silicide (60), the silicon substrate (10), or oxide (20). As a result, each exposed source and drain region is now completely covered by a silicide film and none elsewhere as shown in FIG. 1c.

Following prior art, the next step in completing the process of forming a contact is to deposit an insulating dielectric (70) onto the silicide, and open holes (90) through it down to the silicide layer. Finally, a metal (95) is deposited into the contact holes to make contact with the silicide, thus forming an integrated circuit. It will be noted that after the formation of silicon contact by means of self-aligned salicide, additional masking and etching steps are required to form the contact holes. Furthermore, it will be seen below that the contact holes must also be shaped or contoured in a manner that makes them reliable for which additional steps are required. A method is proposed in this invention where not only self-aligned contacts (SAC) but also self-aligned holes (SAH) can be formed together with the process of contouring the walls of the hole. Thus, at the same time the masking steps are reduced, contact reliability as well as planarization, as explained later, are improved.

As is well appreciated in the art, the geometry and size of the holes govern how well and reliably the contacts can be made. For example, if the walls of the hole are straight and vertical, then the metal that is deposited into the hole may not cover the edge of the hole properly. That is, the metal at the edge of the hole may be sharp and thin, giving rise to higher electrical resistance, or, for that matter, to breakage later on. In prior art, this is sometimes referred to as the "step coverage" problem and numerous methods have been devised to overcome it. Contouring the sidewalls or tapering the edge of the hole are some of the techniques that are used and are described below briefly. However, it will be seen that the conventional techniques are complex and complicated.

The additional steps in forming contact holes (90) over source/drain regions after the formation of SAC are shown in FIGS. 2a–2c. FIG. 2a depicts the regions near either the source or drain of FIG. 1e. In order to form contact hole (90), substrate (10) is first covered with an oxide which typically is thermal oxide (70). (It will be noted that like elements are denoted by like reference numerals through the various Figures). Then, photoresist (80) is applied as a thin film over the oxide layer (70). It is now necessary to image the photoresist with the contact hole pattern using the well-known photolithographic techniques including the development step as explained earlier. The remaining photoresist film is then used as an etch-mask (80) containing openings (85) for contact holes to be formed in the next step. A "window" or contact hole is etched into oxide layer (70) through hole pattern (85) in photoresist mask (80). After the formation of contact hole (90), photoresist mask (80) is removed as shown in FIG. 2b.

Prior to the final step of deposition of metal (95), the surface of the silicon wafer is cleaned to remove the thin native-oxide layer that rapidly forms on a silicon surface whenever it is exposed to oxygen, such as in air. Metal film (90) is deposited onto the wafer surface to make contact with the silicon wherever contact holes have been formed in the oxide. In the simplest contact structure, the deposited metal is aluminum (Al) or an Al:Si alloy. For completeness, we note that after deposition, the contact structure is subjected to a thermal cycle known as sintering of annealing. The purpose of this step is to bring the metal and silicon surfaces into intimate contact. The nature and the area of the contact become important for small contact holes required with especially, sub-micron technologies.

Various methods are used for formation of contact hole windows. For relatively large openings greater than about 2.0 micrometers ($\mu$m), wet etching is often used. Its widespread use stems from the fact that the liquid etchant systems can be formulated to have very high selectivity to both the substrate and masking layers. That is, during the etching of contact holes in the oxide, neither the mask—which is usually a photoresist—nor the substrate materials are very much affected. The isotropic nature of wet etching, however, makes it difficult when etching smaller sized and closely patterned contact holes, especially for the sub-micron VLSI and ULSI (ultra large scale integrated) technologies. This is because, when etching progresses at the same rate in all directions, that is, isotropically, undercutting occurs if the thickness of the film layer that is being etched is comparable to the minimum pattern dimensions. Of course, undercutting between small and closely spaced holes would be intolerable. Hence, since many films used in VLSI fabrication are 0.5–1.0 $\mu$m thick, reproducible and controllable transfer of patterns in the 1–2 $\mu$m range becomes difficult if not impossible with wet etching, according to S. Wolf in his book "Silicon Processing for the VLSI Era," vol. 2, Lattice Press, Sunset Beach, Calif., 1990, p. 539. As is well known, an alternative to "wet" etching is the "dry" etching which offers the capability of anisotropic removal of material. Dry etching essentially consists of "ion assisted etching processes" of which reactive ion etching (RIE) providing anisotropic etching, and plasma etching providing isotropic etching are well known.

Though anisotropic etching is useful because it avoids undercutting, that is not always desirable for the reasons indicated in FIG. 2b. When the sidewalls of hole (90) are formed vertically as shown in FIG. 2b by dry etching, the step edge (73) of the hole is not usually well covered when the hole is later filled with metal (95). Poor step coverage can lead to electrical discontinuities. This problem can sometimes be alleviated by first using wet or dry isotropic etching at the mouth of the opening (85) in FIG. 2a, and then following it with anisotropic etching so that the resulting hole geometry is contoured rather than being straight and vertical.

Contouring holes come into play in a different way when forming holes having different depths in an insulating layer which covers a semiconductor substrate. Via holes, for example, connecting different conductive layers reach to different depths in a wafer. In order to keep the misalignment to a minimum between holes having different depths, U.S. Pat. No. 5,444,020 teaches a method of selectively etching the upper parts of the insulating layer which correspond to contact holes having a greater depth the shallowest contact hole, using a first mask pattern. This first etch is accomplished by means of isotropic etching to form large contoured hole in the upper parts of the layer. Then a second etch step is used to selectively etch the remainder of the insulating layer for all of the contact holes at the same time using a second mask pattern. The second etch is anisotropic to yield vertical straight walls.

It is evident that conventional methods of forming holes—irrespective of whether they are contact holes or via holes—involves plurality of masking and etching steps. Although self-aligned contact (SAC) techniques are utilized for forming contacts, thus eliminating one masking step, additional masking and etching steps are still needed for forming contact holes. It will be apparent to those skilled in the art that a method for eliminating the additional steps is needed. It is disclosed in this invention that by integration of a novel self-aligned hole (SAH) etching process with taper contouring, the number of steps can be reduced and, at the same time, the reliability of the contact improved.

SUMMARY OF THE INVENTION

It is therefore an object of this invention to provide a new method for fabricating contact holes in semiconductor devices.

It is another object of this invention to reduce the number of steps in forming contact holes in semiconductor devices.

It is still another object of this invention to provide a method for improving the reliability of contact holes through widened contact areas.

It is yet another object of this invention to improve planarization of semiconductor substrates.

These objects are accomplished by providing a silicon substrate having active and field regions defined and polysilicon gate formed. A metal silicide and a diffusion barrier are next deposited to form polycide. Oxide spacers are formed. Next, tetraethyl orthosilicate (TEOS) is deposited conformally to cover the substrate, followed by deposition of borophosphosilicate glass (BPSG). Glass is spun to form SOG and to planarize the substrate surface. Etchback is performed exposing BPSG. Photoresist is next applied and patterned to form etch-mask for etching holes. Isotropic etching is performed until the polycide gate is reached with a taper. Next, anisotropic etching is performed until the shallow tapered hole is extended into the polysilicon layer in the polycide gate. In other areas other than those corresponding to the location of the gates, the shallow tapered holes are again extended by means of another etch until they reach contact areas over devices in the substrate. The net result is a whole set of holes which are self-aligned and which are formed by means of a single photoresist mask.

BRIEF DESCRIPTION OF THE DRAWINGS

In the accompanying drawings, similar numerals refer to similar parts throughout the several views.

FIGS. 1a–1e show steps of forming conventional self-aligned contact (SAC).

FIGS. 2a–2c show steps of forming a conventional metal-semiconductor contact structure.

DESCRIPTION OF THE PREFERRED EMBODIMENTS

Figure 3A:
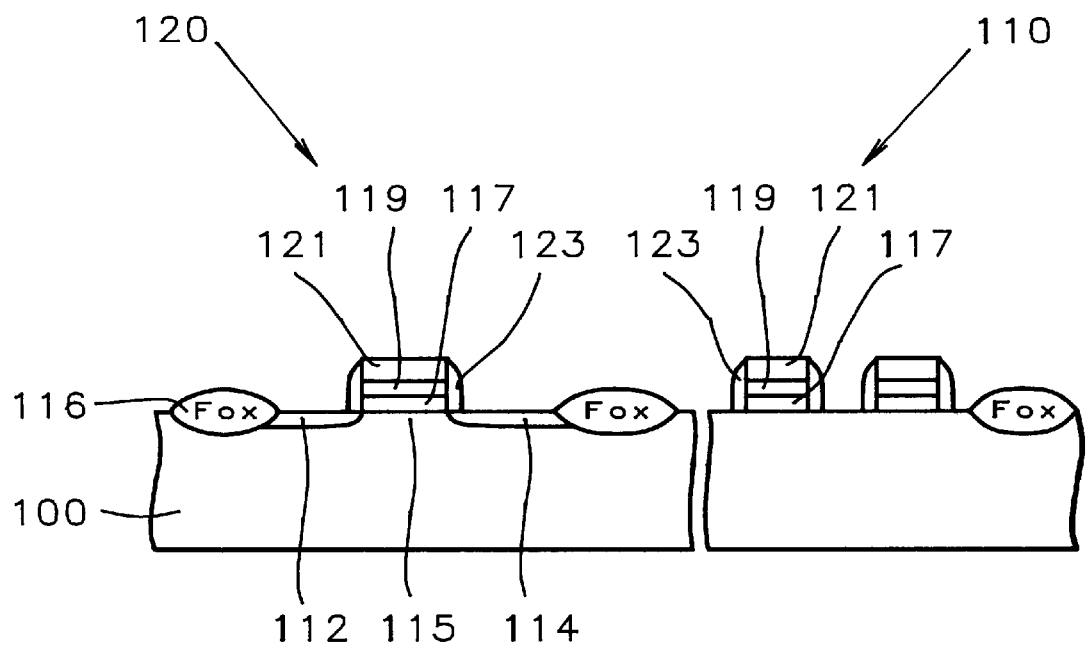
FIG. 3a is a partial cross section view of MOS devices showing the formation of polycide gates according to this invention, in the peripheral circuit and cell areas of a semiconductor substrate.

Referring now to the drawings, in particular to FIGS. 3a–3f, there are shown schematically, steps for forming self-aligned and tapered contact holes over device areas, or regions, in a semiconductor substrate. The devices are formed in cell areas (110) and peripheral circuit (120) areas of substrate (100) shown in FIG. 3a. Substrate (100) is provided with source (112), drain (114), and field oxide isolation regions (116). A thin gate oxide (not shown) is formed over the channel region (115) and a polysilicon (poly-Si) gate (117) is formed thereon. Although not necessary, it is preferred that poly-gate (117) is polycide formed of tungsten-silicide ($WSi_2$) (119) as shown in FIG. 3a. Polycide structure of lines or runners in cell area (110) also comprise poly-Si (117) and $WSi_2$ (119).

Silicon nitride (SiN) layer (121), used as a diffusion barrier, is next deposited by LPCVD (low pressure chemical vapor deposition) at pressure 0.1 torr and temperature 700° C. to a thickness between about 1000 and 2000 angstroms (Å). When etched anisotropically with a recipe comprising reactive fluorinated gases $CF_4/CHF_3$ along with argon (Ar) ions and $O_2$ through a photoresist mask, the polycide layer (117, 119) is formed as shown in FIG. 3a with a portion of SiN remaining as layer (121) on the polycide structure. Subsequently, a layer of $Si_3N_4$ is deposited to a thickness between about 800 to 1200 Å, and then etched back anisotropically to form SiN sidewall spacers as shown in the same FIG. 3a.

Figure 3B:
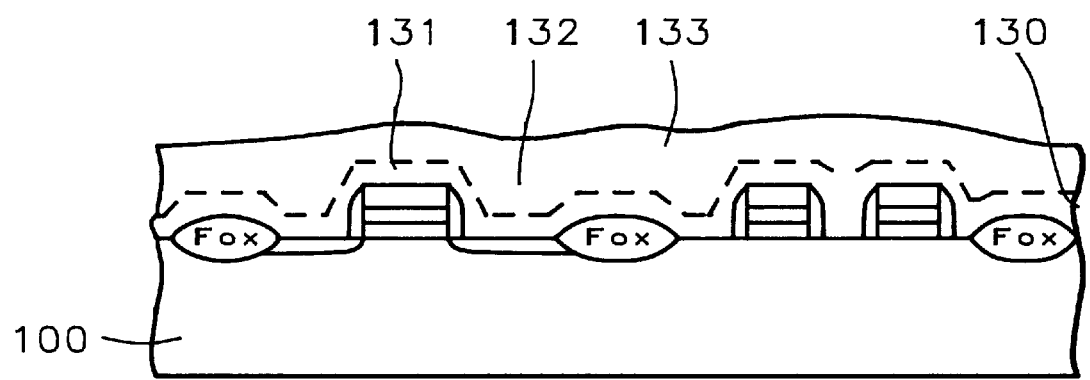
FIG. 3b is a partial cross section of a semiconductor substrate showing the deposition of various dielectric layers according to this invention.

A composite dielectric layer (130) is then formed comprising three layers (131, 132, 133) as shown in FIG. 3b. First layer (131) is formed by depositing tetraethyl orthosilicate (TEOS) to a thickness between about 500 to 2000 angstroms (Å). Second layer (132) is borophosphosilicate glass deposited to a thickness between about 4000 to 9000 Å, at pressure between about 200 to 760 torr and temperature between about 350 to 600° C. and then reflowed between about 800 to 900° C. for between about 30 to 60 minutes. The third top layer (133) is spin-on-glass (SOG) formed to a thickness between about 2000 to 5000 Å and cured at between about 400 to 500° C. for between about 30 to 90 minutes.

Figure 3C:
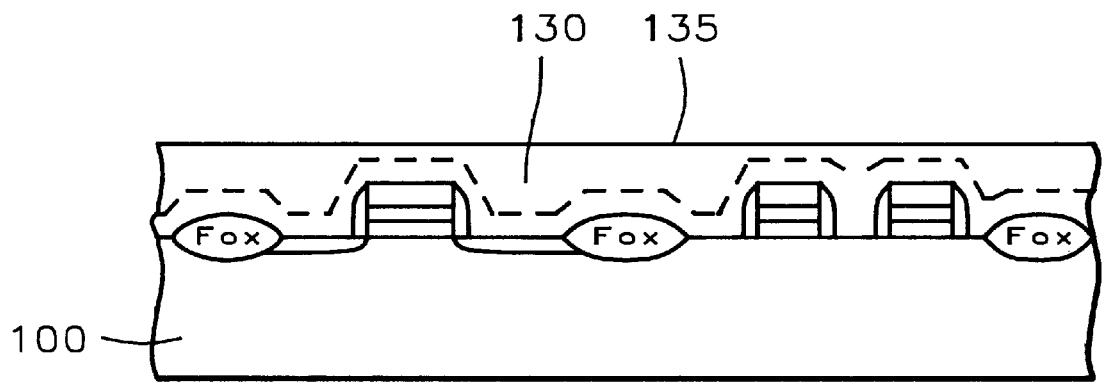
FIG. 3c is a partial cross section of a semiconductor substrate showing the planarization, according to this invention, of the dielectric layers of FIG. 3b.
Figure 3D:
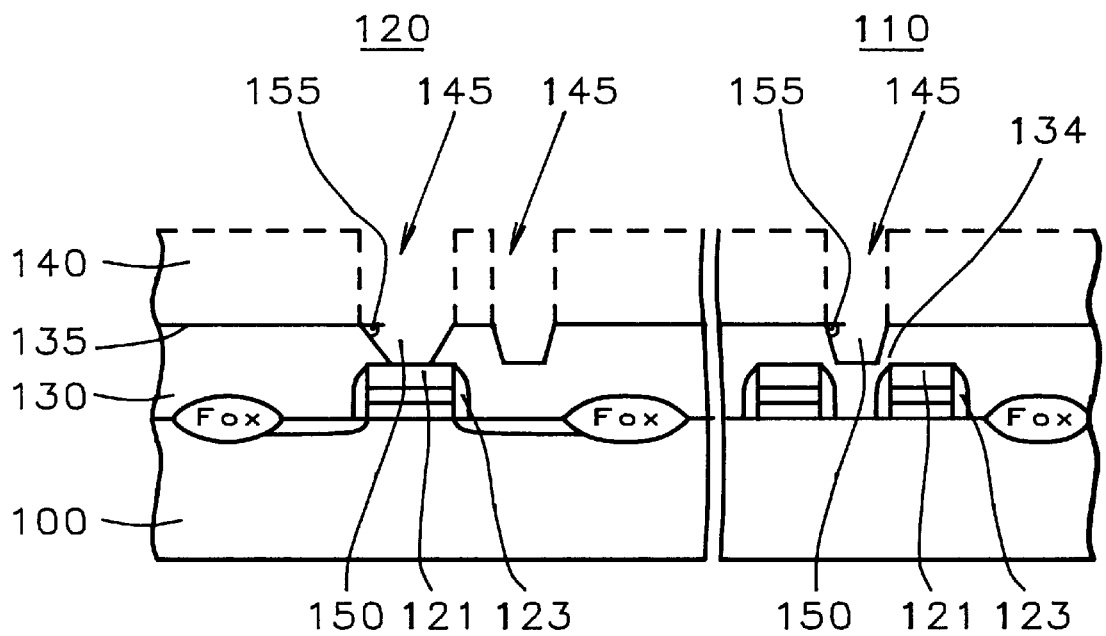
FIG. 3d is a partial cross section of a semiconductor substrate showing the partial opening of tapered holes of this invention where the tapered holes reach the tops of the gate regions in the peripheral circuit areas of the substrate.

Composite layer (130) is planarized to level (135) until BPSG is reached with thickness between about 2000 to 4000 Å shown in FIG. 3c using reactive ion etching recipe comprising $CF_4/CHF_3$ and Ar. Subsequently, a layer of photoresist (140) is applied to planarized layer (130) and holes (145) at the locations where the contact holes will be formed are patterned in the photoresist as shown in FIG. 3d. It is preferred that the thickness of photoresist layer (140) is between about 7000 to 12000 Å. First, a shallow taper etching is performed isotropically into layer (130) using recipe comprising $CHF_3$ at a flow rate between about 50 to 100 standard cubic centimeters per minute (sccm) and CO between about 200 to 300 sccm at a pressure between about 30 to 50 millitorr (mtorr) and RF power between about 1000 to 1500 watts. Shallow because, holes (150) do not span the whole depth to reach their respective contact areas. It is preferred that the taper angle of partially etched shallow hole (150) is between about 75 to 85 degrees. With this range of angle in the taper, it is assured that while silicon nitride (SiN) layer (121) is exposed in holes in the peripheral (120) devices during etching, it is not exposed in partial holes in cell areas (110) as shown in FIG. 3d. That is, an intervening gap (134) is preserved in layer (130) adjacent to layer (121) and oxide spacer (123) so that SiN is not etched in the cell areas. The variability of angle (155) is controlled between about ±2° by varying the etching recipe.

Figure 3E:
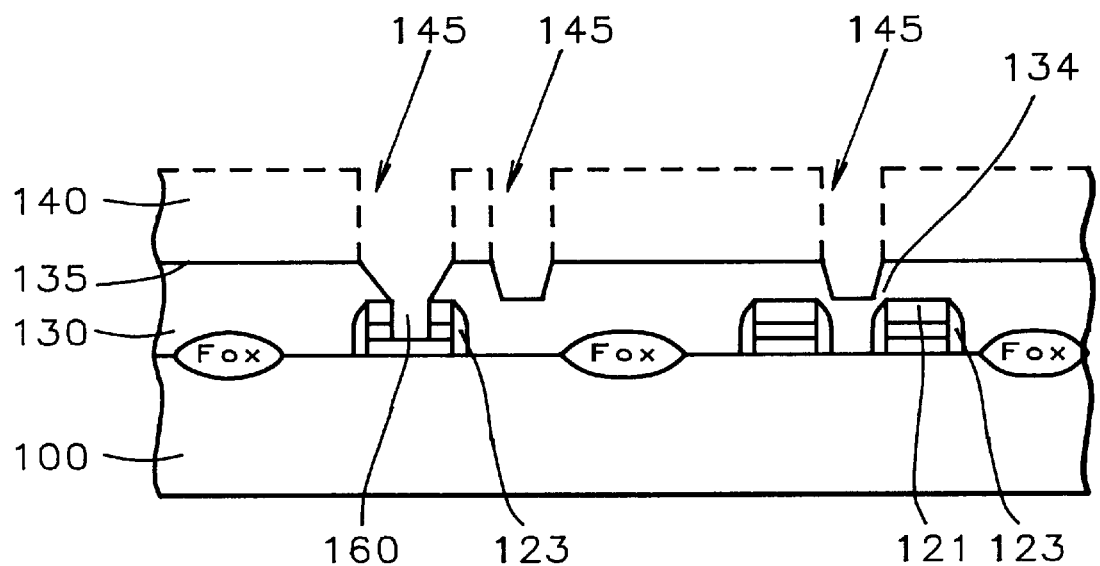
FIG. 3e is a partial cross section of a semiconductor substrate showing the further etching, according to this invention, of tapered holes of FIG. 3d into the gate regions in the peripheral circuit areas of the substrate.

At the next key step, a sulfur-hexafluoride ($SF_6$) based etchant with high selectivity to oxide is used to etch SiN and WSi with the same photoresist mask (140) that was used in the first step of forming shallow holes (150), as shown in FIG. 3e. The plasma etch recipe comprises $SF_6$ and HBr with helium at flow rates, respectively, between about 50 to 100 sccm, between about 15 to 30 sccm, and between about 100 to 300 sccm at a pressure between about 200–800 mtorr and RF power between about 200 to 400 watts. In other words, oxide layer (130), and regions (134) thereof, perform as a mask with respect to the $SF_6$ based etchant. Thus, only (150) holes that are exposed to SiN and WSi at the bottom are etched further to form full-depth holes (160) shown in FIG. 3e.

Figure 3F:
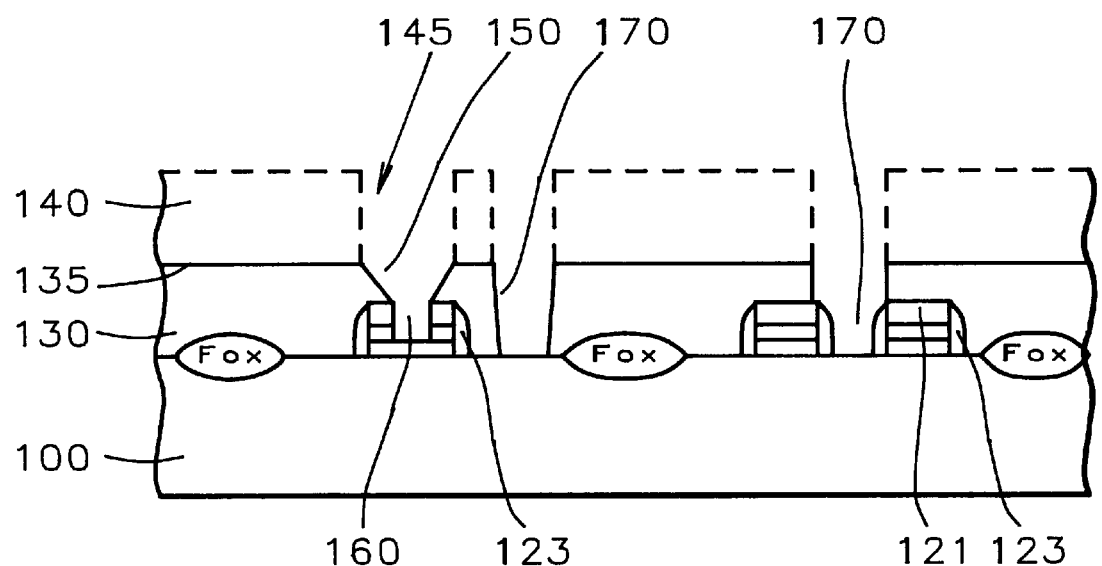
FIG. 3f is a partial cross section of a semiconductor substrate showing the further etching, according to this invention, of tapered holes of FIG. 3d into the substrate regions in the cell areas of the substrate.

A main feature and key spirit of the present invention is the final step where shallow tapered holes (150) so formed as shown in FIG. 3e serve as in situ mask holes and are used to form the remainder of self-aligned holes (SAH) (170) to full depth as shown in FIG. 3f. The anisotropic SAH etchant is of high selectivity to SiN and poly-Si and has the recipe comprising $C_4F_8$ and CO with Ar at flow rates, respectively, between about 10 to 20 sccm, between about 150 to 200 sccm, and between about 300 to 400 sccm at a pressure between about 30 to 50 mtorr and RF power between about 1000 to 1500 watts. It will be appreciated that contrary to common practice, no additional masking steps are required to form the self-aligned contact holes (170) and (160) of this invention. In other words, holes (160) and (170) reaching the gate and the substrate, respectively, are completely aligned with respect to each other with one mask and also provide the maximum contact area attainable for minimum contact resistance and improved reliability.

In the descriptions of the embodiment given above, numerous details were set forth, such as specific materials, process parameter, etc., in order to provide a thorough understanding of the present invention. It will be obvious, however, to those skilled in the art that these specific details need not be employed to practice the present invention.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming self-aligned holes comprising the steps of:
   providing a substrate having peripheral device region and cell device region formed therein;
   forming a gate oxide layer over said peripheral region and said cell region;
   forming a silicide layered polysilicon gate, or polycide gate on said gate oxide layer in said peripheral region and said cell region;
   forming a barrier layer over said polycide gate in said peripheral region and said cell region;
   forming spacers on sidewalls of said polycide gate in said peripheral region and cell region;
   forming over said substrate including said barrier layer over polycide gate a composite dielectric layer comprising a first dielectric layer underlying a second layer underlying a third dielectric layer, wherein said second dielectric layer is reflowed and said third dielectric layer is etched back to form a planarized surface;
   forming a shallow tapered hole in said composite dielectric layer by means of isotropic etching, wherein said tapered hole stops on said barrier layer on said polycide gate in said peripheral region and within said composite dielectric layer in said cell region;
   forming a full-depth hole reaching said polysilicon gate in said peripheral region by etching through said shallow tapered hole into said barrier layer and into said silicide layer over said polysilicon gate by means of an anisotropic etch recipe having high selectivity to oxide; and
   forming a full-depth hole reaching said substrate in said cell region by means of anisotropic etching through said shallow tapered hole with a recipe having high selectivity to said barrier layer and said polysilicon gate.

2. The method of claim 1, wherein said silicide layer comprises tungsten-silicon (WSi).

3. The method of claim 1, wherein said barrier layer is silicon-nitride (SiN).

4. The method of claim 1, wherein said etching through said barrier layer is accomplished by recipe comprising reactive fluorinated gases $CF_4/CHF_3$ with argon (Ar) ions and $O_2$.

5. The method of claim 1, wherein said spacers comprise SiN.

6. The method of claim 1, wherein said first dielectric layer is tetraethyl orthosilicate having a thickness between about 500 to 2000 Å.

7. The method of claim 1, wherein said second dielectric layer is borophosphosilicate glass having a thickness between about 4000 to 9000 Å.

8. The method of claim 1, wherein said reflowing of second dielectric layer is accomplished at a temperature between about 800 to 900° C., and for between about 30 to 60 minutes.

9. The method of claim 1, wherein said forming a third dielectric layer is accomplished by spinning on glass.

10. The method of claim 1, wherein etching back said third dielectric layer is accomplished by reactive ion etching recipe comprising $CF_4/CHF_3$ and Ar.

11. The method of claim 1, wherein said isotropic etching of shallow tapered hole is accomplished by recipe comprising $CHF_3$ at a flow rate between about 50 to 100 standard cubic centimeters per minute (sccm) and CO between about 200 to 300 sccm at a pressure between about 30 to 50 millitorr (mtorr) and RF power between about 1000 to 1500 watts.

12. The method of claim 1, wherein said forming a full-depth hole reaching said polysilicon gate in said peripheral region is accomplished by an anisotropic etch recipe comprising $SF_6$ and HBr with helium at flow rates, respectively, between about 50 to 100 sccm, between about 15 to 30 sccm, and between about 100 to 300 sccm at a pressure between about 200–800 mtorr and RF power between about 200 to 400 watts.

13. The method of claim 1, wherein said forming a full-depth hole reaching said substrate in said cell region is accomplished by an anisotropic recipe comprising $C_4F_8$ and CO with Ar at flow rates, respectively, between about 10 to 20 sccm, between about 150 to 200 sccm, and between about 300 to 400 sccm at a pressure between about 30 to 50 mtorr and RF power between about 1000 to 1500 watts.

14. A method of forming self-aligned holes comprising the steps of:
   providing a semiconductor substrate having devices formed therein and a dielectric layer having a planarized surface formed thereon;
   forming shallow tapered holes by means of isotropic etching said dielectric layer to a depth reaching top of gate regions of peripheral devices;
   forming shallow tapered holes by means of isotropic etching said dielectric layer to a depth reaching therebetween tops of but not on gate regions of cell devices;
   forming full-depth holes over said gates of peripheral devices by means of anisotropic etching to a depth reaching the top of the lowest layer forming said gate with a recipe having a high selectivity to oxide; and
   forming full-depth holes over cell areas to a depth reaching said substrate with an etch recipe having high selectivity to silicon nitride and polysilicon.

15. The method of claim 14, wherein said planarized surface is spin-on-glass.

16. The method of claim 14, wherein said gate regions comprise polysilicon and tungsten silicide, and have silicon nitride sidewall spacers.

17. The method of claim 14, wherein said tapered shallow holes have a taper less than 90°.

18. The method of claim 14, wherein said isotropic etching of said tapered holes is accomplished by recipe comprising $CHF_3$ at a flow rate between about 50 to 100 standard cubic centimeters per minute (sccm) and CO between about 200 to 300 sccm at a pressure between about 30 to 50 millitorr (mtorr) and RF power between about 1000 to 1500 watts.

19. The method of claim 14, wherein said anisotropic etching of said full-depth holes over said gates of peripheral devices is accomplished by anisotropic etch recipe comprising $SF_6$ and HBr with helium at flow rates, respectively, between about 50 to 100 sccm, between about 15 to 30 sccm, and between about 100 to 300 sccm at a pressure between about 200–800 mtorr and RF power between about 200 to 400 watts.

20. The method of claim 14, wherein said anisotropic etching of said full-depth holes over cell areas is accomplished by recipe comprising $C_4F_8$ and CO with Ar at flow rates, respectively, between about 10 to 20 sccm, between about 150 to 200 sccm, and between about 300 to 400 sccm at a pressure between about 30 to 50 mtorr and RF power between about 1000 to 1500 watts.

* * * * *